US 6,610,190 B2

(12) United States Patent
Basol et al.

(10) Patent No.: US 6,610,190 B2
(45) Date of Patent: Aug. 26, 2003

(54) METHOD AND APPARATUS FOR ELECTRODEPOSITION OF UNIFORM FILM WITH MINIMAL EDGE EXCLUSION ON SUBSTRATE

(75) Inventors: Bulent M. Basol, Manhattan Beach, CA (US); Cyprian Uzoh, Milpitas, CA (US); Homayoun Talieh, San Jose, CA (US)

(73) Assignee: NuTool, Inc., Milpitas, CA (US)

( * ) Notice: Subject to any disclaimer, the term of this patent is extended or adjusted under 35 U.S.C. 154(b) by 42 days.

(21) Appl. No.: 09/760,757

(22) Filed: Jan. 17, 2001

(65) Prior Publication Data

US 2002/0053516 A1 May 9, 2002

Related U.S. Application Data

(60) Provisional application No. 60/245,211, filed on Nov. 3, 2000.

(51) Int. Cl.[7] .............................. C25D 5/08; C25D 5/00; C25D 7/12; C25D 17/00; C25D 17/04
(52) U.S. Cl. ...................... 205/133; 205/137; 205/157; 204/224 R; 204/297.05; 204/297.1
(58) Field of Search .................... 204/224 R, 275.1, 204/295, 297.03, 297.05; 205/118, 133, 137, 157, 261, 291

(56) References Cited

U.S. PATENT DOCUMENTS

| 3,328,273 A | 6/1967 | Creutz et al. ............... 204/52 |
| 4,430,173 A | 2/1984 | Boudot et al. ............ 204/52 R |
| 4,948,474 A | 8/1990 | Miljkovic ................. 204/52.1 |

(List continued on next page.)

FOREIGN PATENT DOCUMENTS

| WO | 98/27585 | 6/1998 |
| WO | WO 00/26443 | 5/2000 |

OTHER PUBLICATIONS

James J. Kelly et al., "Leveling and Microstructural Effects of Additives for Copper Electrodeposition", Journal of the Electrochemical Society, 146 (7), 1999, pp. 2540–2545.
Joseph M. Steigerwald et al., "Chemical Mechanical Planarization of Microelectronic Materials", A Wiley–Interscience Publication, 1997, by John Wiley & Sons, Inc. pp. 212–222.
Robert D. Mikkola et al., "Investigation of the Roles of the Additive Components for Second Generation Copper Electroplating Chemistries Used for Advanced Interconnect Metalization", 2000 IEEE, IEEE Electron Devices Society, pp. 117–119.

Primary Examiner—Patrick Ryan
Assistant Examiner—Thomas H. Parsons
(74) Attorney, Agent, or Firm—NuTool, Legal Department

(57) ABSTRACT

A system for depositing materials on a surface of a wafer or removing materials from the surface of a wafer includes an electrode, a shaping plate, a liquid solution contained between the electrode and the wafer surface, and electrical contact members contacting selected locations on the wafer surface. The shaping plate is supported between the electrode and the wafer surface such that an upper surface of the shaping plate faces the wafer surface. The shaping plate can have a plurality of channels where each puts the wafer surface in a fluid communication with the electrode. The electrical contact members contact the selected locations on the wafer surface through a recessed edge of the shaping plate such that when the wafer is rotated, the selected contact locations move over the shaping plate and are plated under an applied potential. Advantages of the invention include substantially full surface treatment of the wafer.

42 Claims, 12 Drawing Sheets

U.S. PATENT DOCUMENTS

| | | | |
|---|---|---|---|
| 4,954,142 A | 9/1990 | Carr et al. .................... 51/309 |
| 4,975,159 A | 12/1990 | Dahms ........................ 204/15 |
| 5,084,071 A | 1/1992 | Nenadic et al. ............... 51/309 |
| 5,256,565 A | 10/1993 | Bernhardt et al. .......... 437/228 |
| 5,354,490 A | 10/1994 | Yu et al. .................... 252/79.1 |
| 5,516,412 A | 5/1996 | Andricacos et al. .... 204/224 R |
| 5,681,215 A | 10/1997 | Sherwood et al. .......... 451/388 |
| 5,755,859 A | 5/1998 | Brusic et al. ............... 106/1.22 |
| 5,762,544 A | 6/1998 | Zuniga et al. .............. 451/285 |
| 5,770,095 A | 6/1998 | Sasaki et al. ................. 216/38 |
| 5,773,364 A | 6/1998 | Farkas et al. ............... 438/692 |
| 5,793,272 A | 8/1998 | Burghartz et al. .......... 336/200 |
| 5,795,215 A | 8/1998 | Guthrie et al. .............. 451/286 |
| 5,807,165 A | 9/1998 | Uzoh et al. .................... 451/41 |
| 5,840,629 A | 11/1998 | Carpio ....................... 438/692 |
| 5,858,813 A | 1/1999 | Scherber et al. ............ 438/693 |
| 5,884,990 A | 3/1999 | Burghartz et al. .......... 336/200 |
| 5,897,375 A | 4/1999 | Watts et al. ................. 438/639 |
| 5,911,619 A | 6/1999 | Uzoh et al. .................... 451/5 |
| 5,922,091 A | 7/1999 | Tsai et al. .................... 51/306 |
| 5,930,669 A | 7/1999 | Uzoh .......................... 438/627 |
| 5,933,753 A | 8/1999 | Simon et al. ................ 438/629 |
| 5,954,997 A | 9/1999 | Kaufman et al. ........... 257/79.1 |
| 5,976,331 A | 11/1999 | Chang et al. ............ 204/224 R |
| 5,985,123 A | 11/1999 | Koon ........................... 205/96 |
| 6,001,235 A | 12/1999 | Arken et al. ................. 205/137 |
| 6,004,880 A | 12/1999 | Liu et al. ..................... 438/692 |
| 6,027,631 A | 2/2000 | Broadbent ................... 205/137 |
| 6,063,506 A | 5/2000 | Andricacos et al. ......... 428/546 |
| 6,066,030 A | 5/2000 | Uzoh ........................... 451/41 |
| 6,071,388 A | 6/2000 | Uzoh ......................... 204/297 |
| 6,074,544 A | 6/2000 | Reid et al. ................... 205/157 |
| 6,103,085 A | 8/2000 | Woo et al. ................... 205/143 |
| 6,132,587 A | 10/2000 | Jorne et al. .................. 205/123 |
| 6,136,163 A * | 10/2000 | Cheung et al. ............. 204/198 |
| 6,156,167 A | 12/2000 | Patton et al. ................ 204/270 |
| 6,159,354 A | 12/2000 | Contolini et al. ............. 205/96 |
| 6,162,344 A | 12/2000 | Reid et al. ................... 205/152 |
| 6,176,992 B1 | 1/2001 | Talieh ......................... 205/87 |
| 6,261,426 B1 * | 7/2001 | Uzoh et al. ............. 204/224 R |

\* cited by examiner

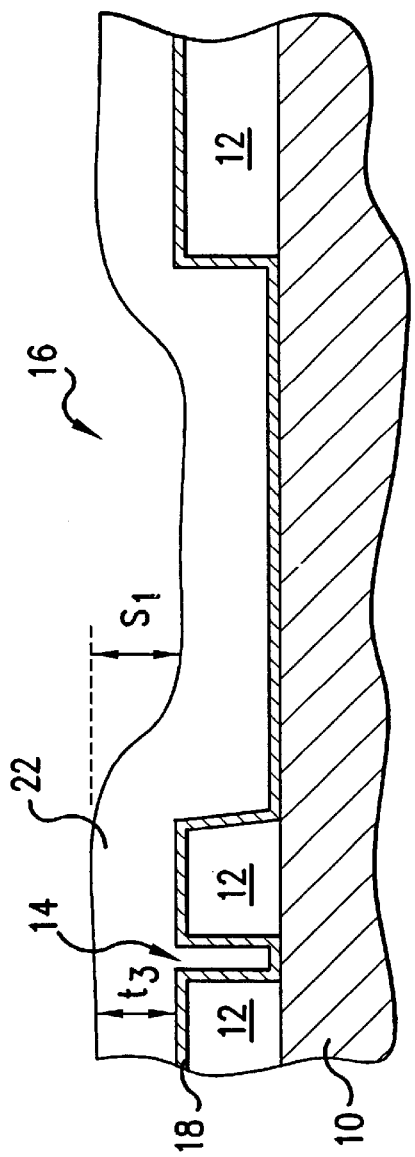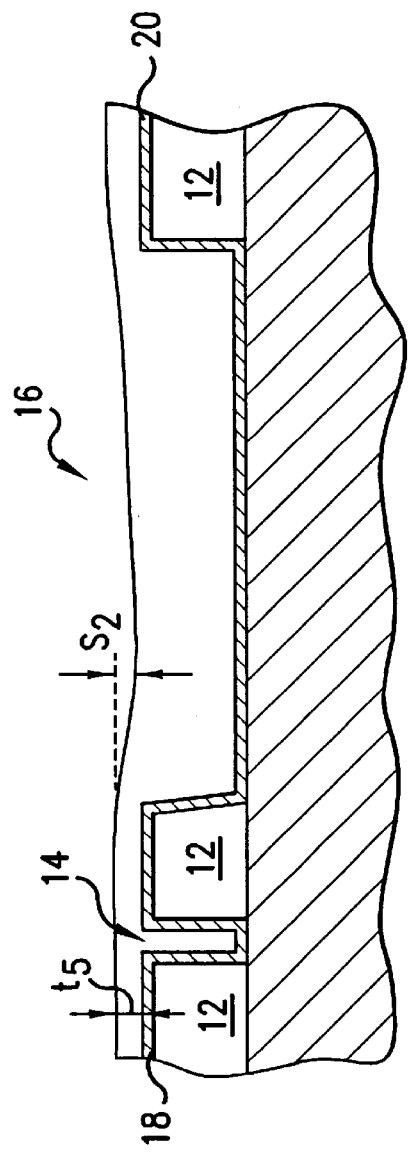

US 6,610,190 B2

METHOD AND APPARATUS FOR ELECTRODEPOSITION OF UNIFORM FILM WITH MINIMAL EDGE EXCLUSION ON SUBSTRATE

This application claims the priority of prior U.S. provisional application No. 60/245,211, filed Nov. 3, 2000, the entire disclosure of which is expressly incorporated by reference herein.

BACKGROUND OF THE INVENTION

1. Field of the Invention

The present invention generally relates to electrodeposition process technology and, more particularly, to an electrodeposition process that yields uniform and planar deposits.

2. Description of Related Art

Conventional semiconductor devices generally include a semiconductor substrate, usually a silicon substrate, and a plurality of sequentially formed dielectric interlayers such as silicon dioxide and conductive paths or interconnects made of conductive materials. The interconnects are usually formed by filling a conductive material in trenches etched into the dielectric interlayers. In an integrated circuit, multiple levels of interconnect networks laterally extend with respect to the substrate surface. The interconnects formed in different layers can be electrically connected using vias or contacts. A conductive material filling process of such features, i.e., via openings, trenches, pads or contacts, can be carried out by depositing a conductive material over the substrate including such features. Excess conductive material on the substrate can then be removed using a planarization and polishing technique such as chemical mechanical polishing (CMP).

Copper (Cu) and Cu alloys have recently received considerable attention as interconnect materials because of their superior electromigration and low resistivity characteristics. The preferred method of Cu deposition is electrodeposition. During fabrication, copper is electroplated or electrodeposited on substrates that are previously coated with barrier and seed layers. Typical barrier materials generally include tungsten (W), tantalum (Ta), titanium (Ti), their alloys and their nitrides. A typical seed layer material for copper is usually a thin layer of copper that is CVD or PVD deposited on the aforementioned barrier layer.

There are many different designs of Cu plating systems. For example, U.S. Pat. No. 5,516,412 issued on May 14, 1996, to Andricacos et al. discloses a vertical paddle plating cell that is configured to electrodeposit a film on a flat article. U.S. Pat. No. 5,985,123 issued on Nov. 16, 1999, to Koon discloses yet another vertical electroplating apparatus, which purports to overcome the non-uniform deposition problems associated with varying substrate sizes.

During the Cu electrodeposition process, specially formulated plating solutions or electrolytes are used. These solutions or electrolytes contain ionic species of Cu and additives to control the texture, morphology, and the plating behavior of the deposited material. Additives are needed to make the deposited layers smooth and somewhat shiny.

There are many types of Cu plating solution formulations, some of which are commercially available. One such formulation includes Cu-sulfate ($CuSO_4$) as the copper source (see James Kelly et al., Journal of The Electrochemical Society, Vol. 146, pages 2540–2545, (1999)) and includes water, sulfuric acid ($H_2SO_4$), and a small amount of chloride ions. As is well known, other chemicals, which are often referred to as additives, can be added to Cu plating solutions to achieve desired properties of the deposited material (e.g., see Robert Mikkola and Linlin Chen, "Investigation of the Roles of the Additive Components for Second Generation Copper Electroplating Chemistries used for Advanced Interconnect Metallization", Proceedings of the International Interconnect Technology Conference, pages 117–119, Jun. 5–7, 2000).

FIGS. 1 through 2 exemplify a conventional electrodeposition method and apparatus. FIG. 1A illustrates a substrate 10 having an insulator layer 12 formed thereon. Using conventional etching techniques, features such as a row of small vias 14 and a wide trench 16 are formed on the insulator layer 12 and on the exposed regions of the substrate 10. In this example, the vias 14 are narrow and deep; in other words, they have high aspect ratios (i.e., their depth to width ratio is large). Typically, the widths of the vias 14 are sub-micronic. The trench 16 shown in this example, on the other hand, is wide and has a small aspect ratio. The width of the trench 16 may be five to fifty times or more greater than its depth.

FIGS. 1B–1C illustrate a conventional method for filling the features with copper material. FIG. 1B illustrates that a barrier/glue or adhesion layer 18 and a seed layer 20 are sequentially deposited on the substrate 10 and the insulator 12. The barrier layer 18 may be Ta, W, Ti, their alloys, their nitrides or combinations of them. The barrier layer 18 is generally deposited using any of the various sputtering methods, by chemical vapor deposition (CVD), or by electroless plating methods. Thereafter, the seed layer 20 is deposited over the barrier layer 18. The seed layer 20 is typically copper if the conductor to be plated is also copper and may be deposited on the barrier layer 18 using various sputtering methods, CVD, or electroless deposition or their combinations.

In FIG. 1C, after depositing the seed layer 20, a conductive material layer 22 (e.g., copper layer) is partially electrodeposited thereon from a suitable plating bath or bath formulation. During this step, an electrical contact is made to the copper seed layer 20 and/or the barrier layer 18 so that a cathodic (negative) voltage can be applied thereto with respect to an anode (not shown) Thereafter, the copper material layer 22 is electrodeposited over the substrate surface using plating solutions, as discussed above. By adjusting the amounts of the additives, such as the chloride ions, the suppressor/inhibitor, and the accelerator, it is possible to obtain bottom-up copper film growth in the small features.

As shown in FIG. 1C, the copper material 22 completely fills the via 14 and is generally conformal in the large trench 16, because the additives that are used are not operative in large features. For example, it is believed that the bottom up deposition into the via 14 occurs because the suppressor/inhibitor molecules attach themselves to the top of the via 14 to suppress the material growth thereabouts. These molecules can not effectively diffuse to the bottom surface of the via 14 through the narrow opening. Preferential adsorption of the accelerator on the bottom surface of the via 14 results in faster growth in that region, resulting in bottom-up growth and the Cu deposit profile as shown in FIG. 1C. Here, the Cu thickness t1 at the bottom surface of the trench 16 is about the same as the Cu thickness t2 over the insulator layer 12.

As can be expected, to completely fill the trench 16 with the Cu material, further plating is required. FIG. 1D illustrates the resulting structure after additional Cu plating. In this case, the Cu thickness t3 over the insulator layer 12 is relatively large and there is a step $S_1$ from the top of the Cu layer on the insulator layer 12 to the top of the Cu layer 22 in the trench 16. For integrated circuit (IC) applications, the Cu layer 22 needs to be subjected to CMP or some other material removal process so that the Cu layer 22 as well as the barrier layer 18 on the insulator layer 12 are removed, thereby leaving the Cu layer only within the features 14 and 16. These removal processes are known to be quite costly.

Methods and apparatus to achieve a generally planar Cu deposit as illustrated in FIG. 1E would be invaluable in terms of process efficiency and cost. The Cu thickness t5 over the insulator layer 12 in this example is smaller than the traditional case as shown in FIG. 1D, and the height of the step $S_2$ is also much smaller. Removal of the thinner Cu layer in FIG. 1E by CMP or other methods would be easier, providing important cost savings.

In co-pending U.S. application Ser. No. 09/201,929, entitled "METHOD AND APPARATUS FOR ELECTRO-CHEMICAL MECHANICAL DEPOSITION", filed Dec. 1, 1998 and commonly owned by the assignee of the present invention, a technique is disclosed that achieves deposition of the conductive material into the cavities on the substrate surface while minimizing deposition on the field regions by polishing the field regions with a pad as the conductive material is deposited, thus yielding planar copper deposits.

FIG. 2A shows a schematic depiction of a prior art electrodeposition system 30. In this system, a wafer 32 is held by a wafer holder 34 with the help of a ring clamp 36 covering the circumferential edge of the wafer 32. An electrical contact 38 is also shaped as a ring and connected to the (−) terminal of a power supply for cathodic plating. The wafer holder 34 is lowered into a plating cell 40 filled with plating electrolyte 42. An anode 44, which makes contact with the electrolyte 42, is placed across from the wafer surface and is connected to the (+) terminal of the power supply. The anode 44 may be made of the material to be deposited, i.e., copper, or of an appropriate inert anode material such as platinum, platinum coated titanium or graphite. A plating process commences upon application of power. In this plating system, the electrical contact 38 is sealed from the electrolyte and carries the plating current through the circumference of the wafer 32. However, the presence of the contact 38 and the clamp 36 at the circumference of the wafer 30 is an important drawback with this system and increases the edge exclusion indicated by 'EE' in FIG. 2A. As a result of edge exclusion, a very valuable prime area on the surface of the wafer 32 is lost.

FIGS. 1A through 1E show how the features on the wafer surface are filled with copper. For this filling process to be efficient and uniform throughout the wafer, it is important that a uniform thickness of copper be deposited over the whole wafer surface. Thickness uniformity needs to very good because non-uniform copper thickness causes problems during the CMP process. As shown in FIG. 2B, in order to improve uniformity of the deposited layers, shields 46 may be included in prior art electroplating systems such as that shown in FIG. 2A. In such systems, either the wafer 32 or the shield 46 may be rotated. Such shields are described, for example, in U.S. Pat. No. 6,027,631 to Broadbent, U.S. Pat. No. 6,074,544 to Reid et al. and U.S. Pat. No. 6,103,085 to Woo et al.

In view of the foregoing, there is a need for alternative electrodeposition processes and systems which minimize edge exclusion problems and deposit uniform conductive films.

SUMMARY OF THE INVENTION

The present invention involves depositing a conductive material on an entire surface of a semiconductor wafer through an electrodeposition process. Specifically, the present invention provides a method and a system to form a substantially flat conductive material layer on an entire surface of a semiconductor wafer without losing any space on the surface for electrical contacts, i.e., without wafer edge exclusion.

In one aspect of the present invention, a process for depositing materials on a surface of a wafer, without excluding any region for electrical contacts on the surface wherein the wafer has a maximum lateral dimension, is provided. The process includes the steps of providing an anode, supporting a shaping plate between the anode and the surface of the wafer, flowing an electrolyte through the shaping plate and between the anode and the surface of the wafer, contacting a contact region of the surface of the wafer with a contact member, and applying a potential difference between the anode and the contact member.

A shaping plate can be supported between the anode and the surface of the substrate such that an upper surface of the shaping plate faces a surface of the wafer. The shaping plate includes a plurality of openings such that each opening puts the surface of the wafer in fluid communication with the anode. The shaping plate has a lateral dimension that is longer than the maximum lateral dimension of the wafer. The contact members contact contact regions on the surface of the wafer outside of a "recessed" edge of the shaping plate and thereby make electrical contact to the surface of the wafer. When the potential difference is applied between the anode and the contact member, material deposition on a deposition region of the surface of the wafer through the shaping plate occurs when the wafer is in a first position. By moving the wafer into a second position while contacting the contact region with the contact member, material deposition on both the contact regions and the deposition region occurs.

According to another aspect of the present invention, a system for depositing materials on a surface of a wafer having a maximum lateral dimension is provided. The system includes an anode, a shaping plate defining a recessed edge, a liquid electrolyte contained between the anode and the surface of the substrate, and an electrical contact member for contacting a contact region on the surface of the substrate outside of the recessed edge of the shaping plate.

The shaping plate can be supported between the anode and the surface of the wafer such that an upper surface of the shaping plate faces the surface of the wafer. The shaping plate includes a plurality of openings. The upper surface of the shaping plate has a lateral dimension that is longer than the maximum lateral dimension of the wafer. The liquid electrolyte flows through the openings of the shaping plate and against the surface of the wafer such that the electrolyte always contacts a first region of the surface of the wafer. The electrical contact member establishes electrical contact with a second region of the surface of the wafer outside of the recessed edge of the shaping plate. The second region intermittently contacts the electrolyte when the wafer is rotated over the shaping plate.

According to still another aspect of the invention, a system by which conductive material can be deposited out of an electrolyte onto a surface of a semiconductor substrate includes an assembly by which the electrolyte is supplied to the surface of the substrate during deposition of the material, and an anode which is contacted by the electrolyte during this deposition. At least one contact is electrically interconnected with the surface at a selected area of the surface during the deposition. Deposition of the material progresses discontinuously on the selected area and continuously on the rest of the surface as at least one of the contact and the surface moves with respect to the other during application of a potential difference between the anode and the contact.

A device which alleviates non-uniformity between deposition of the material on the selected area and on the rest of the surface can be provided. The device can include a shield, with openings defined therein, disposed between the anode and the surface to alter an electric field distribution. Alternatively, the device can include a perforated plate provided between the anode and the surface with asperity regions having different degrees of open area.

The assembly by which electrolyte is supplied may include a cup defining a cavity through which the electrolyte flows during deposition of the conductive material. The anode can be received in the cavity, while the contact is disposed outside of said cavity. The assembly further includes an inlet for supplying the electrolyte to the cavity.

A rotatable, and preferably translatable, carrier holds the substrate during deposition of the conductive material so as to move the surface of the substrate with respect to the contact.

The shaping plate can disposed between the anode and the surface during deposition of the conductive material. The shaping plate is porous and permits through flow of the electrolyte.

If the polarity of the system is reversed, the system may be used to remove material, by electroetching, in a uniform manner from the wafer or substrate surface instead of depositing the material. In this case, the plating electrolyte may be replaced with a commonly known electroetching or electropolishing solution. Also, in this case, the anode may be replaced with an inert electrode made of inert material.

These and other features, aspects and advantages of the present invention will become better understood with reference to the following drawings, description, and claims.

BRIEF DESCRIPTION OF THE DRAWINGS

FIG. 1D is a schematic view of the structure shown in FIG. 1C wherein the layer has been fully deposited;

FIG. 1E is a schematic view of the structure shown in FIG. 1D wherein a more planar layer has been formed;

DETAILED DESCRIPTION OF THE INVENTION

The present invention involves depositing a conductive material on an entire surface or full face of a semiconductor substrate or wafer through an electrodeposition process. As will be described below, the present invention provides a method and a system to form a substantially flat conductive material layer on the entire surface of a semiconductor substrate without losing any space on the surface for electrical contacts, i.e., without wafer edge exclusion. The full face deposition process of the present invention advantageously achieves deposition of a conductive material in a plurality of cavities, such as trenches, vias, contact holes and the like, on an entire surface of a semiconductor wafer. In one embodiment, the present invention employs a shaping cup or an anode cup and delivers the electrolyte directly onto the surface of the wafer so as to deposit conductive material onto the surface of the wafer. In another embodiment, the conductive material is deposited through a perforated plate. In this embodiment, the perforated plate facilitates uniform deposition of the conductive material. In yet another embodiment, the present invention achieves deposition of the conductive material through the perforated plate into the features of the surface of the wafer while minimizing the deposition on the top surface regions between the features by contacting, sweeping and polishing of the surface with the perforated plate of the present invention.

The process of the present invention exhibits enhanced deposition characteristics resulting in layers having flatness previously unattainable and conductive layers with materials characteristics surpassing that of prior art layers that have been produced using prior art processes and devices.

Figure 1A:
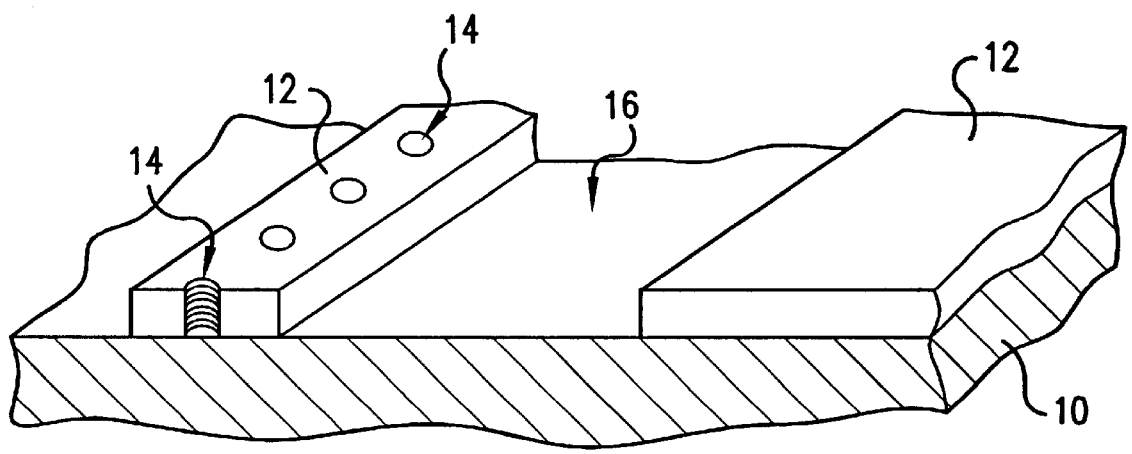
FIG. 1A is a schematic view of a semiconductor substrate having an isolation structure formed on top of the substrate wherein the isolation structure has been etched to form trench and via features on the substrate.
Figure 1B:
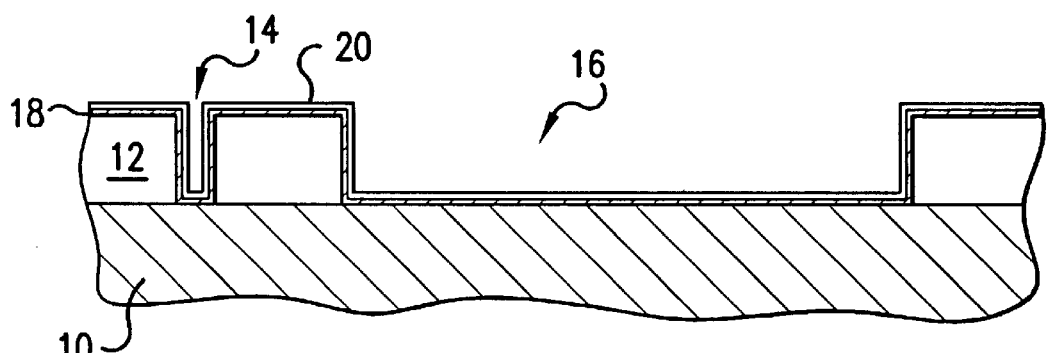
FIG. 1B is a partial cross-sectional view of the substrate shown in FIG. 1A wherein a barrier layer and seed layer have been formed on the features and the isolation or insulator layer.
Figure 1C:
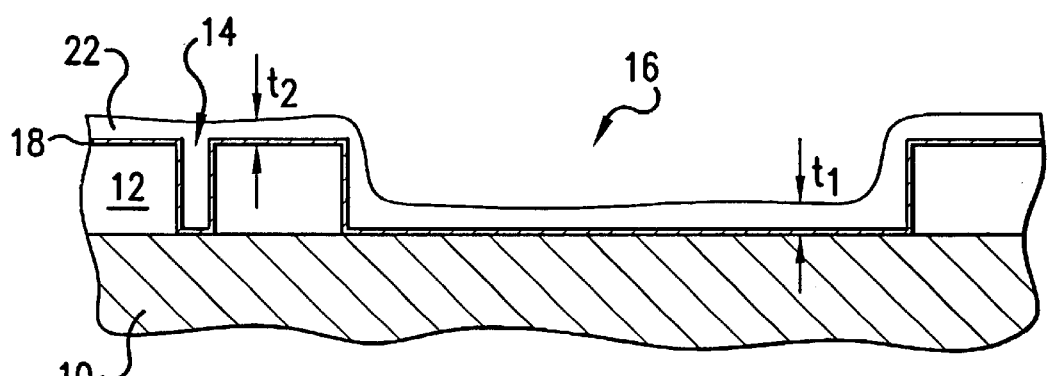
FIG. 1C is a schematic view of the structure shown in FIG. 1B wherein a conventional conformal layer has been partially deposited on the seed layer.
Figure 2A:
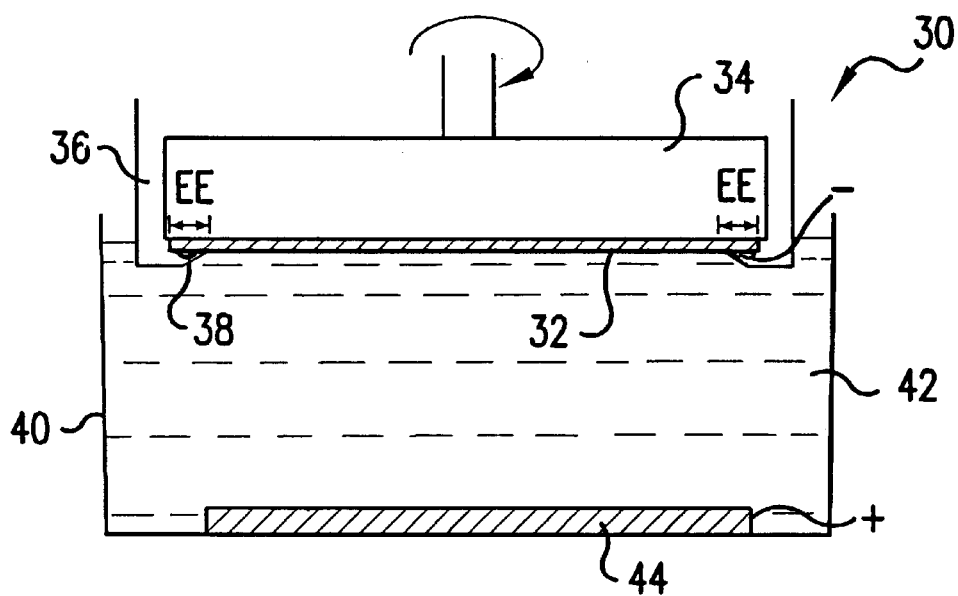
FIG. 2A is a schematic view of a prior art electrodeposition system.
Figure 2B:
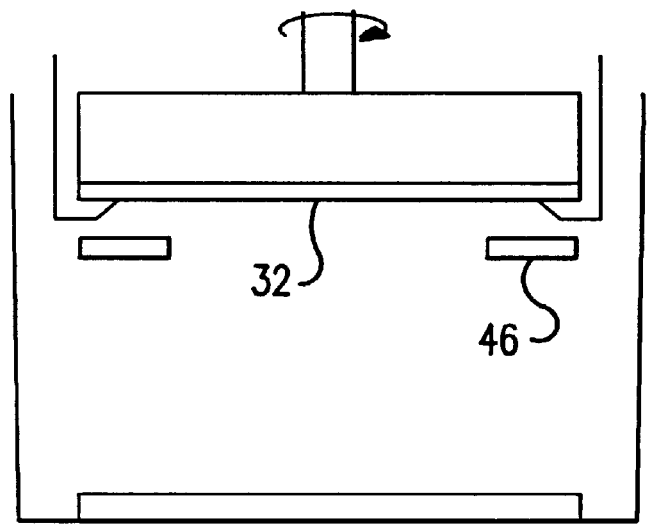
FIG. 2B is a schematic view of another prior art electrodeposition system utilizing shields.
Figure 3:
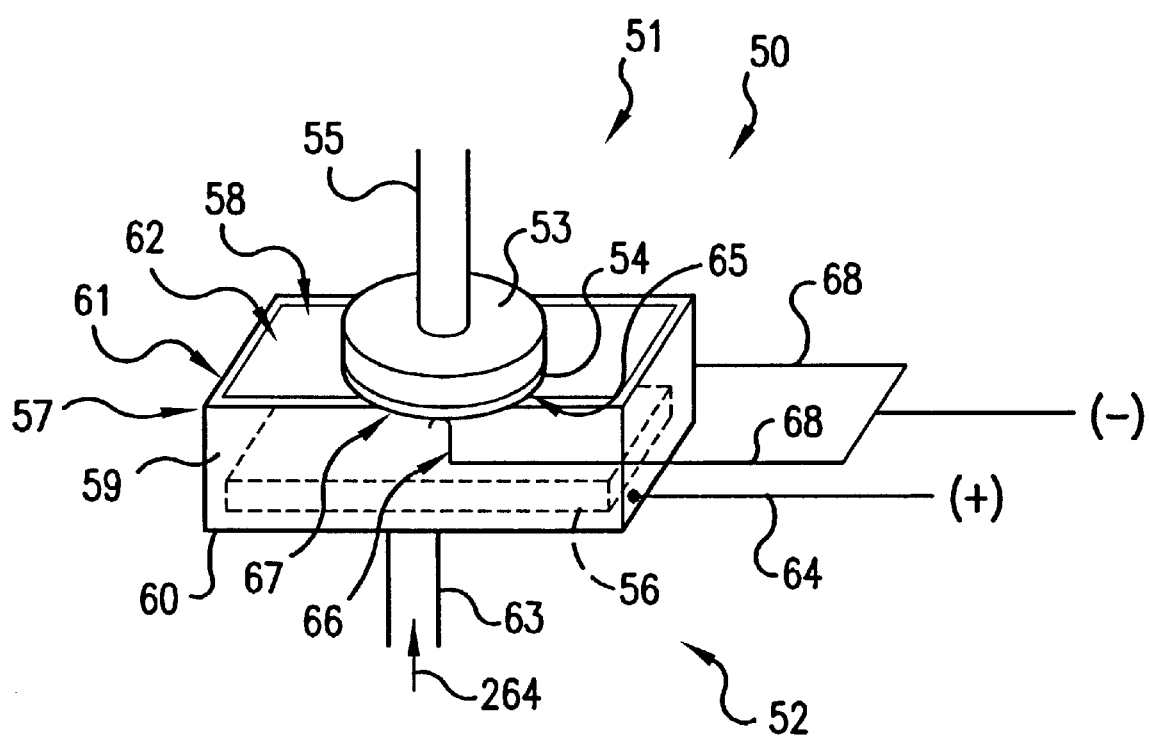
FIG. 3 is a schematic view of an embodiment of a system of the present invention for depositing a conductive material on a full face of a wafer without excluding any edge regions.

Reference will now be made to the drawings wherein like numerals refer to like parts throughout. As shown in FIG. 3, in one embodiment, an electrodeposition system 50 of the present invention may preferably comprise an upper portion 51 and a lower portion 52. In the preferred embodiment, the system 50 may be used to deposit a conductive material such as copper on a semiconductor wafer such as a silicon wafer. It should be noted, however, that although copper is used as an example, the present invention may be used for deposition of other common conductors such as Ni, Pd, Pt, Au and their alloys. The upper portion 51 of the electrodeposition system 50 may be comprised of a carrier assembly having a wafer carrier 53, shown in FIG. 3 holding an exemplary wafer 54, which is attached to a carrier arm 55.

Figure 5:
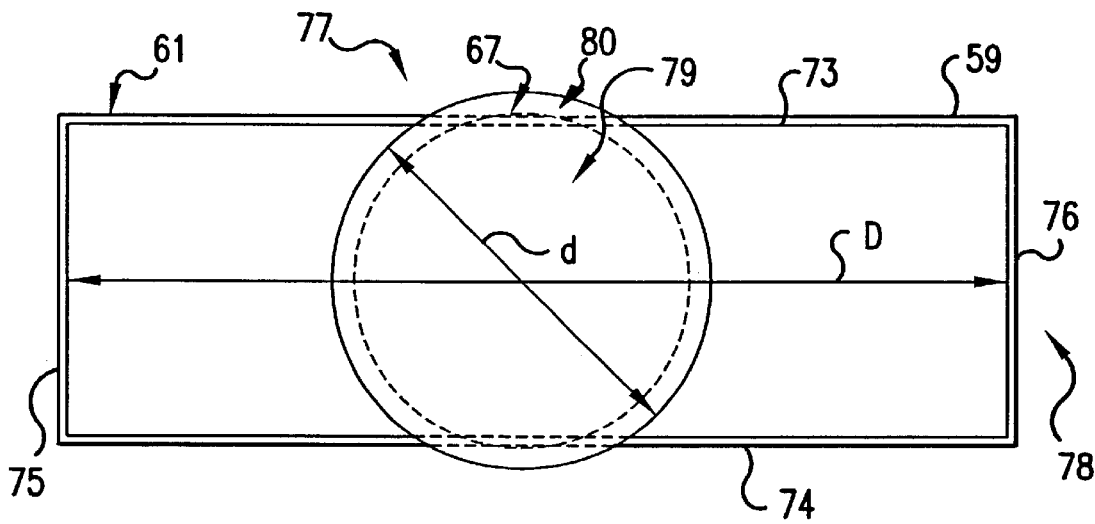
FIG. 5 is a partial plan view of the system shown in FIG. 3 showing intermittent and continuous deposition regions on the wafer.

The lower portion 52 of the system 50 may be comprised of an anode assembly comprising an anode 56 which is preferably placed into an enclosure such as an anode cup 57 or a shaping cup. The anode cup 57 may comprise an inner cavity 58 or housing defined by a peripheral side wall 59 raised above a bottom wall 60. An upper rim frame 61 of the peripheral side wall 59 forms the upper end of the anode cup 57. In this embodiment, the upper rim frame 61 is preferably rectangular in shape and the plane of the rim frame is adapted to be substantially parallel to the wafer 54 when the wafer carrier 53 is lowered toward the rim frame 61. As shown in FIG. 5, the rim frame has a maximum lateral dimension D. A copper plating electrolyte 62 may be pumped into the anode cup 57 through a liquid inlet 63 formed in the bottom wall 60 in the direction of arrow 264. The anode cup and the inlet thus form at least part of an assembly by which the electrolyte 62 can be supplied to a front surface of a semiconductor wafer or substrate. During the electrodeposition process, the anode cup 57 is entirely filled with electrolyte 62 up to the rim frame 61. The anode 56 is electrically connected to a positive terminal of a voltage source (not shown) through an anode connector 64. During the electrodeposition process, the wafer 54 is kept substantially parallel as well as in close proximity to the rim frame 61 and rotated. By controlling the flow rate of the electrolyte 62, the electrolyte makes contact with a front surface 65 of the wafer which is in close proximity. Excess electrolyte flows down over the peripheral side walls 59 and is collected for recycling.

In this embodiment, it is understood that electrical contact members 66 contact or otherwise electrically interconnect with wafer 54 on contact regions 67 of the front surface 65. The position of the contact regions 67 vary circularly with respect to the rim frame 61 as the wafer 54 is rotated over anode cup 57. The contact members 66 are connected to a negative voltage source (not shown) using the connectors 68.

Figure 4:
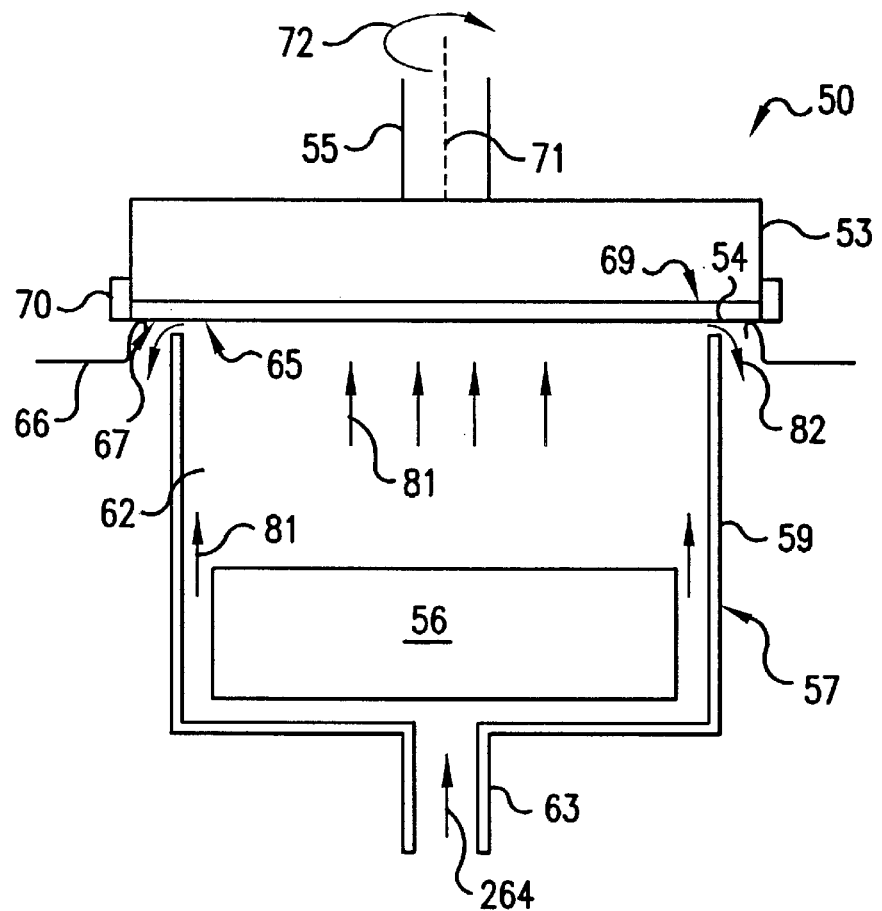
FIG. 4 is a schematic view of the system shown in FIG. 3 showing positions of the electrical contacts and contact regions on the wafer relative to the width of a peripheral side wall of an anode cup of the present invention.

As shown in FIG. 4, the wafer carrier 53 holds the wafer 54 from a back surface 69 of the wafer 54 and against a chuck face of the wafer carrier 53. The wafer 54 may be retained using vacuum suction or a retaining ring 70 (shown in FIG. 4) or both, thereby fully exposing a front surface 65 and the contact regions 67 of the wafer 54. In accordance with the principles of the present invention, the wafer 54 defines a maximum lateral dimension d, which is the diameter of the wafer in this case. Alternatively, the retaining ring 70 may be an integral part of the wafer carrier 53. During the process, the wafer carrier 53 and hence the wafer 54 may be rotated by rotating the carrier arm 55 about a rotation axis 71 or vertical axis of the wafer carrier 53 in a rotation direction 72. As will be described more fully below, the rotation motion moves contact regions 67 over the electrolyte 62 and exposes the contact regions 67 to the electrolyte. The combined effect of both the full exposure of the front surface 65 of the wafer 54 and the ability to expose the contact regions 67 to the electrolyte 62 by moving them over the anode cup 57 results in zero edge exclusion on the wafer 54.

As shown in FIGS. 4 and 5, in this embodiment, the peripheral side wall 59 of the shaping cup or the anode cup 57 may be generally shaped as a rectangular side wall which may comprise a first side wall 73, a second side wall 74, a third side wall 75 and a fourth side wall 76. In this embodiment, the first and second side walls 73, 74 may be longer in length than the length of the third and fourth side walls 75, 76 and form "recessed" edges 77 of the peripheral side wall 59, i.e., edges which are recessed with respect to the circumferential outer edge of the wafer 54. The third and fourth side walls 75, 76 form lateral edges 78 of the peripheral side wall of the anode cup 57. In this embodiment, the width of the anode cup 57 or the distance between the recessed edges 77 is adapted to be smaller than the diameter of the wafer 54, which is the maximum lateral distance d of the wafer, while the length of the anode cup or the distance between the lateral edges, which is the maximum lateral distance D of the rim frame 61, is adapted to be longer than the diameter of the wafer.

Due to the difference between the maximum lateral distance d and the width of the upper rim frame, this configuration exposes contact regions 67 on the wafer 54 and allows placement of the electrical contact members 66 on the contact regions 67. Although in this embodiment the recessed edges 77 are straight, it is within the scope of the present invention that the recessed edges 77 may be formed depressed, V-shaped, or in any other possible configuration that allows placement of electrical contacts on the front surface 65 of the wafer. It should be noted that, at any given instant, the contact regions 67 on the wafer 54 can only be plated with copper when the contact regions 67 are rotated over the electrolyte 62. In this respect, as the wafer 54 is rotated, a first area 79, which is shown by a dotted circle in FIG. 5, always stays over the anode cup and is plated continuously. However, in a selected, second, area 80 of the surface, which is outside the first area 79 and is defined by the contact regions, the deposition process progresses in a discontinuous manner. Therefore, the deposition rate in the first area 79 and the deposition rate in the second area 80 differ and thus the second area 80 may have a thinner deposition layer.

Figure 6:
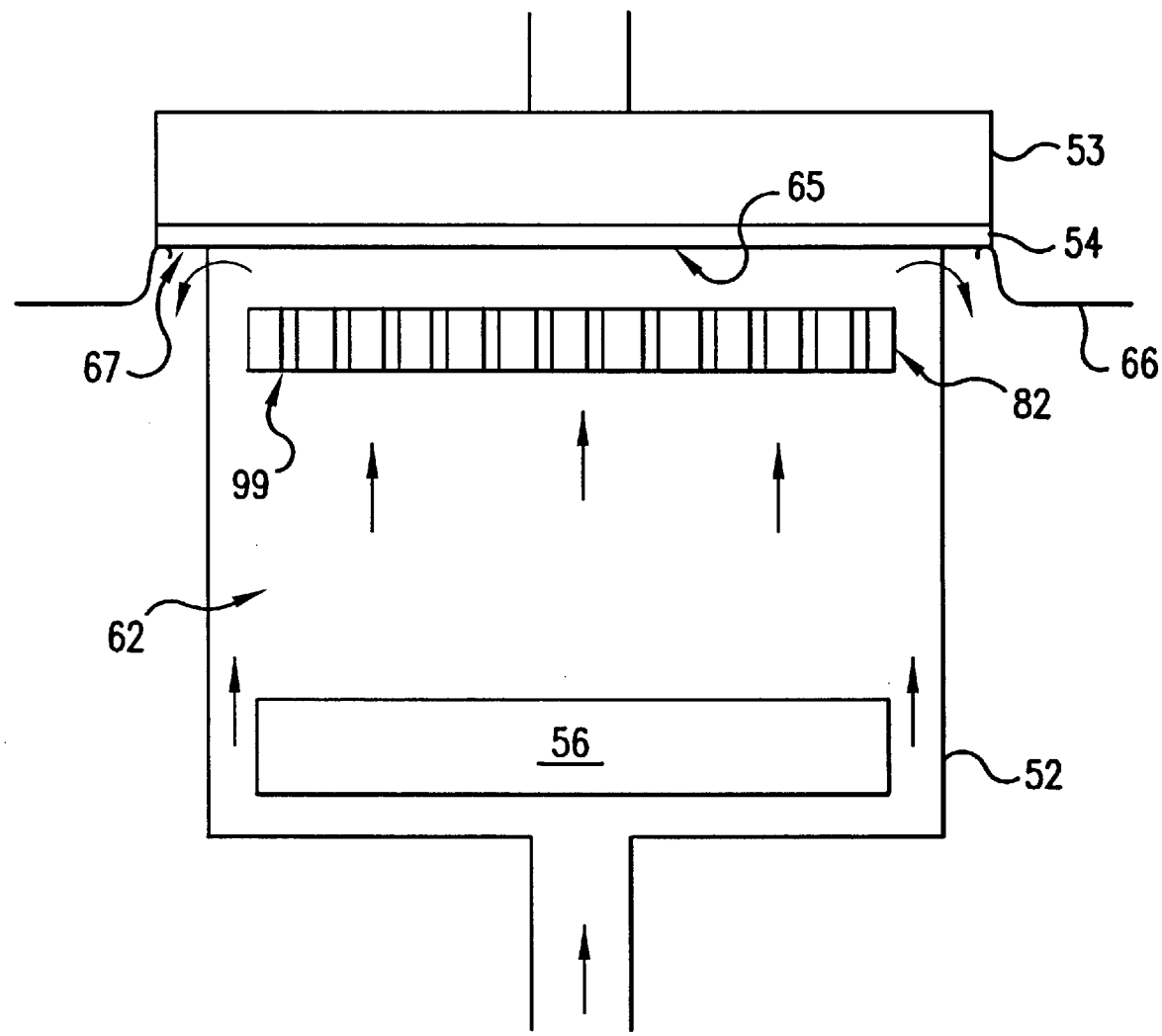
FIG. 6 is a schematic view of the system of the present invention shown in FIG. 3 including shields placed between an anode and cathode of the system.

FIG. 6 shows how this non-uniformity in the deposition layer may be alleviated by the use of shields 82. The shields 82 are immersed into the electrolyte and positioned adjacent to the first area 79 in the manner shown in FIG. 6, although, alternatively, they may rest on the anode 56, if the anode to cathode (wafer) distance is reduced. The shields 82 may have holes 99 or openings in them. The shields alter the electric field distribution between the anode and the first area 79 (see FIG. 5) or the contact regions 67 on the wafer 54 and vary the deposition rate on the first area 79, thereby modifying the thickness profile of the electrodeposited copper across the front surface 65 of the wafer. In this embodiment, the shields 82 may be made of a non-conductive material such as a polymer material.

Referring back to FIGS. 4 and 6, in use, the electrolyte is pumped into the anode cup 57 in the direction of the arrow 264. Once the electrolyte fills the anode cup 57, with the applied pressure, the electrolyte reaches the front surface 65 of the wafer 54 in the direction of the arrows 81. As previously mentioned, the front surface 65 of the wafer 54 is retained at close proximity to the electrolyte. The gap between the front surface 65 of the wafer 54 and the electrolyte surface can be adjusted by vertically moving the carrier assembly 53 along the axis 71. Subsequent to the adjustment of the distance between the front surface 65 and the electrolyte, the electrodeposition process is initiated by applying a potential difference between the anode 56 and the contact members 66. Accordingly, at this stage, the potential difference is selected such that the contact members become more cathodic (−) than the anode. Further, since the contact members touch the front surface 65 of the wafer 54, the front surface 65 is also rendered cathodic. As the deposition process progresses, copper uniformly deposits on the front surface 65. As previously mentioned, the contact regions on the wafer 54 can only be plated with copper when the contact regions 67 are rotated over the electrolyte 62 and hence exposed to the electrolyte. Overflowing electrolyte which is depicted by arrows 83 may be collected and recycled.

Figure 7:
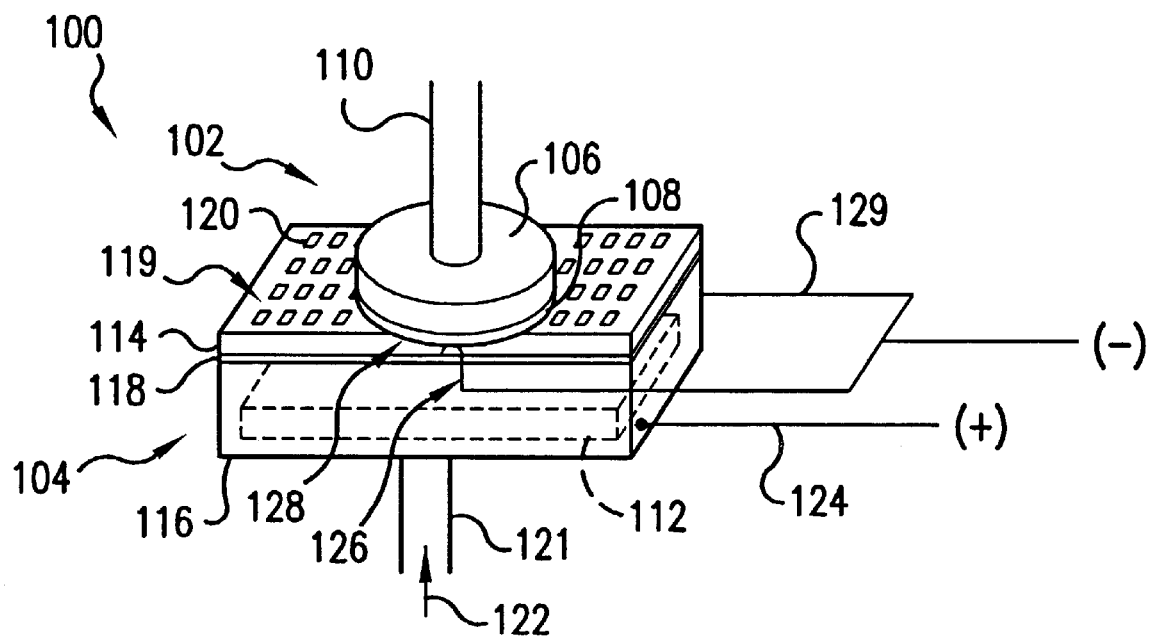
FIG. 7 is schematic view of another embodiment of a system of the present invention for depositing conductive materials on a full face of a wafer without excluding any edge regions.

As shown in FIG. 7, in another embodiment, an electrodeposition system 100 of the present invention may preferably comprise an upper portion 102 and a lower portion 104. In the preferred embodiment, the system 100 may be used to deposit a conductive material such as copper on a semiconductor wafer such as a silicon wafer. As in the previous embodiment, although copper is used as an example, the present invention may be used for deposition of other common conductors such as Ni, Pd, Pt, Au and their alloys. The upper portion 102 of the electrodeposition system 100 may be comprised of a carrier assembly having a wafer carrier 106, shown in FIG. 7 holding an exemplary wafer 108, which is attached to a carrier arm 110. The carrier arm may rotate or move the wafer 108 laterally or vertically.

The lower portion 104 of the system 100 may be comprised of an anode assembly comprising an anode 112, preferably a consumable copper anode, and a shaping plate 114. The anode may preferably be placed into an enclosure such as an anode cup 116 and enclosed by an anode plate 118 upon which the shaping plate 114 may be placed. The shaping plate 114 and the anode plate 118 are both preferably perforated plates. The shaping plate 114 may comprise a plurality of openings 120 or asperities. The openings 120 are adapted to generally match with the openings (see FIGS. 10A and 10B) in the anode plate 118 so that when they are attached together, corresponding openings form channels allowing electrolyte to flow through the plates 114 and 118 and wet the front surface of the wafer 108 during the electrodeposition process. During the electrodeposition process, the wafer 108 may be kept substantially parallel to an upper surface 119 of the shaping plate 114 and rotated. The wafer may also be moved laterally. A copper plating electrolyte is pumped into the anode cup 116 through a liquid inlet 121 in the direction of arrow 122. Again, therefore, the anode cup and the inlet form at least part of an assembly by which the electrolyte can be supplied to a front surface of a semiconductor wafer or substrate. The anode 112 is electrically connected to a positive terminal of a voltage source (not shown) through an anode connector 124. It should be noted that if the shaping plate 114 is made of a rigid material, the anode plate 118 may not be needed.

As will be described more fully below, in this embodiment, electrical contact members 126 contact or otherwise electrically interconnect with the wafer 108 on contact regions 128. The position of the contact regions 128 varies circularly with respect to the shaping plate 114 as the wafer 108 is rotated or moved over the shaping plate 114. The contact members are connected to a negative terminal of the voltage source (not shown) using the connectors 129.

Figure 8:
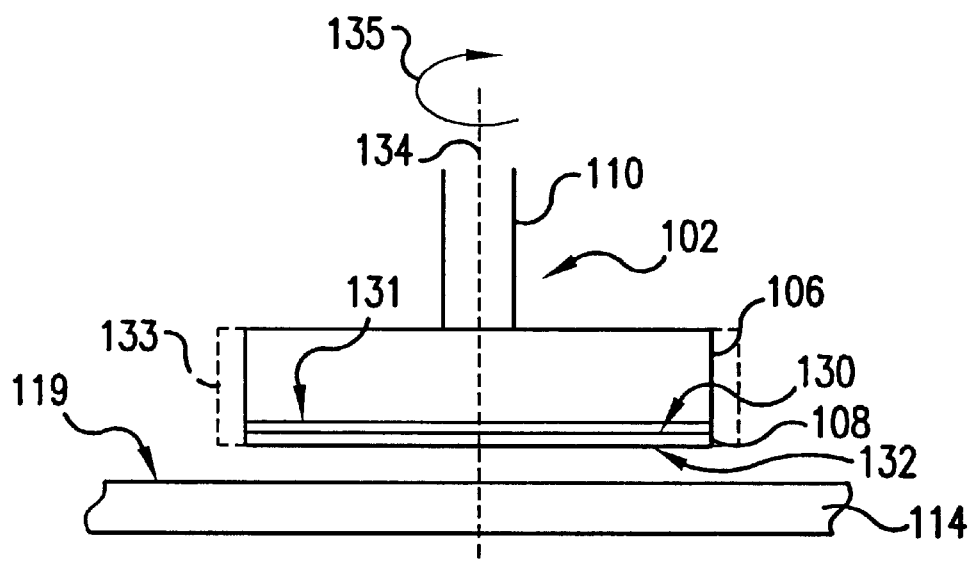
FIG. 8 is a partial schematic view of the system in FIG. 7 showing a wafer carrier assembly and a shaping plate of the present invention.

As shown in FIG. 8, the wafer carrier 106 holds the wafer 108 from a back surface 130 of the wafer 108. The wafer 108 may be held on a lower face 131 or a chuck face of the wafer carrier 106 as in the manner shown in FIG. 8. In this embodiment, the wafer is held using vacuum suction or a retaining ring 133 (shown in FIG. 8), or both, thereby fully exposing a front surface 132 of the wafer 108 to the electrolyte. Alternatively, the retaining ring 133 may be an integral part of the wafer carrier 106. During the process, the wafer carrier 106 and hence the wafer 108 may be rotated by rotating the carrier arm 110 about a rotation axis 134 or vertical axis of the wafer carrier 106 in a rotation direction 135. As will be described more fully below, the rotation motion advantageously moves contact regions 128 over the shaping plate 114 and exposes the contact regions 128 to the electrolyte flowing through the shaping plate (see FIG. 7). The combined effect of both the full exposure of the front surface 132 of the wafer 108 and the ability to continuously expose the contact regions 128 to the electrolyte by moving them over the shaping plate 114 results in zero edge exclusion on the wafer 108.

Figure 9A:
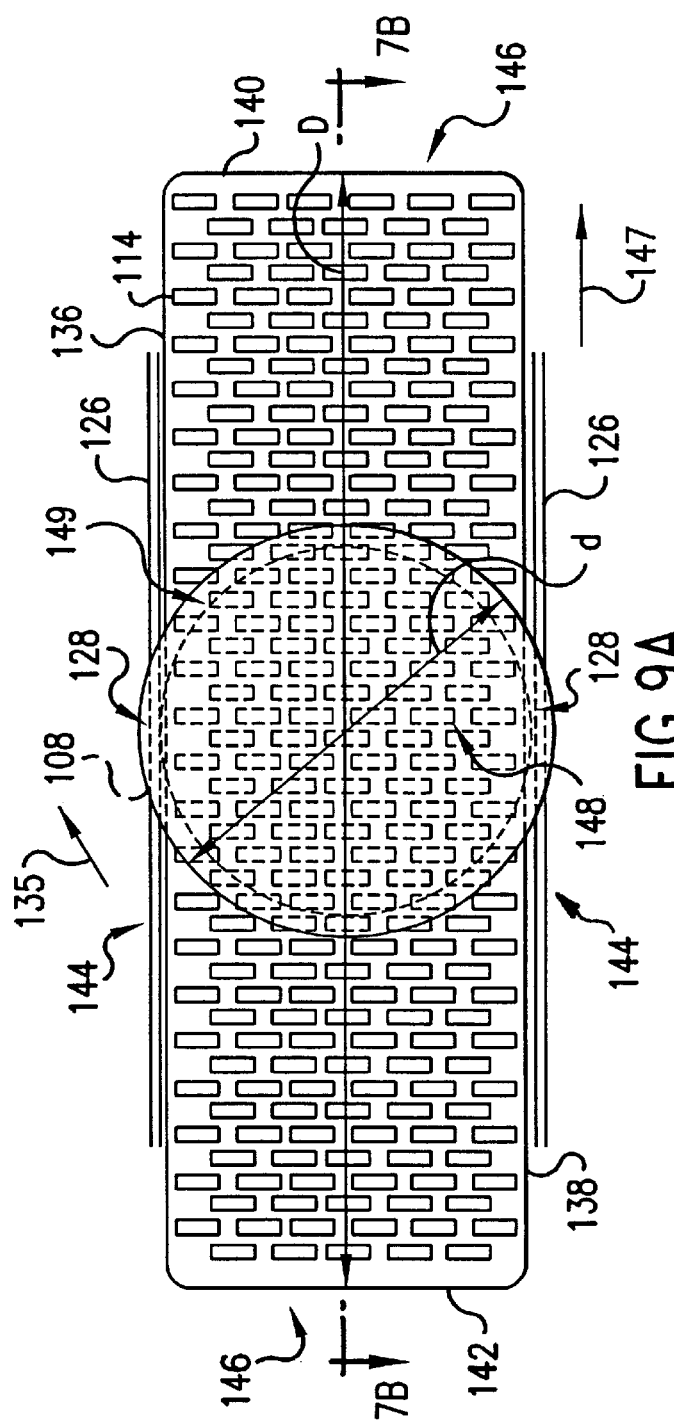
FIG. 9A is a plan view of the shaping plate having a wafer positioned above the shaping plate wherein the wafer has continuous and intermittent deposition regions.
Figure 9B:
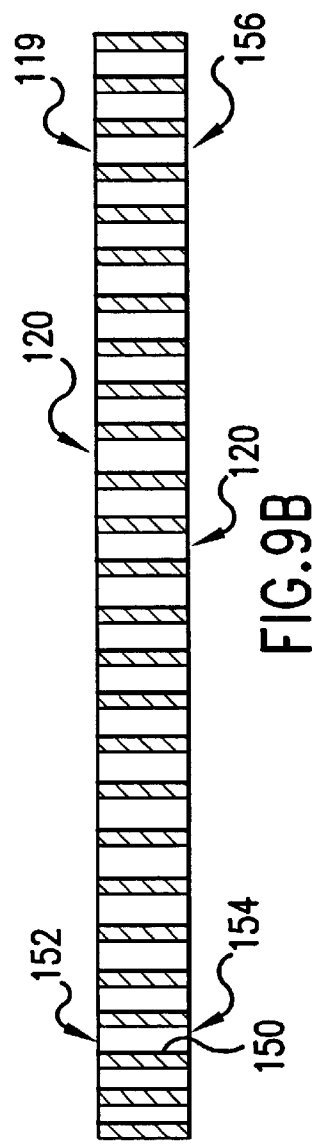
FIG. 9B is a schematic cross sectional view of the shaping plate showing continuous asperities through the shaping plate.

As shown in FIGS. 9A–9B, in this embodiment, the shaping plate 114 of the present invention is generally shaped as a rectangle defined by a first side wall 136, a second side wall 138, a third side wall 140 and a fourth side wall 142. In this embodiment, the first and second side walls 136, 138 may be longer than the third and fourth side walls 140, 142 and form "recessed" edges 144 of the shaping plate 114, i.e., edges which are recessed with respect to the circumferential outer edge of the wafer 108. The third and fourth side walls 140 and 142 form lateral edges 146 of the shaping plate 114. The width of the shaping plate 114 or the distance between the recessed edges is configured to be smaller than the diameter d of the wafer 108. Similar to the previous embodiment, the distance between the lateral edges 146 is the maximum lateral dimension D of the shaping plate 114. Further, the diameter of the wafer is the maximum lateral dimension d of the wafer 108. Although in the preferred embodiment the shaping plate 114 is shaped as a rectangle, the shaping plate may be given any geometrical form.

As shown in FIG. 9A, the difference between the lateral distances d and the width of the shaping plate exposes contact regions 128 on the wafer 108 and further allows placement of the electrical contact members 126 on the contact regions 128 (see FIG. 7). Although in this embodiment the recessed edges are straight in shape, it is within the scope of the present invention that the recessed edges may be formed depressed, V-shaped or in any other possible configuration that allows placement of electrical contacts on a front surface of a wafer. By choosing the width and length of the shaping plate 114 as described above, the contact regions 128 can be contacted by or otherwise electrically interconnected with the electrical contact members 126 as the wafer 108 is moved in a first direction 147 over the shaping plate 114. In FIG. 9A, the contact members are shown as linear strips which would touch the contact regions 128. However, it should be noted that, at a given instant, the contact regions 128 on the wafer can only be plated with copper when the contact regions are rotated over the asperities of the shaping plate 114. In this respect, as the wafer is rotated, a first area 148, which is shown by a dotted circle in FIG. 9A, always stays over the shaping plate 114 and is plated continuously. However, in a second, selected, area 149, which is outside the first area 148 and is defined by contact regions, the deposition process progresses in a discontinuous manner. Therefore, the deposition rate in the first area 148 and the deposition rate in the second area 149 differ and thus the second area 149 is expected to have a slightly thinner deposition layer. As will be described below, this difference in thickness can be eliminated using alternative asperity designs. Additionally, shields 82 as described above and shown in FIG. 6 can be used with this embodiment to provide a uniform deposition layer across the front surface 132 of the wafer 108.

Referring to FIG. 9B, the asperities 120 are defined by an inner side wall 150 extending between an upper opening 152 in the upper surface 119 and a lower opening 154 in a bottom surface 156 of the shaping plate 114. As previously mentioned, during the electrodeposition process, the electrolyte solution reaches the front surface of the wafer through the asperities 120. Depending on the functionality of the shaping plate 114, the shaping plate 114 may be made of an insulating material or a conductive material. If only electrodeposition is carried out, the shaping plate may be made of a conductive material. However, if the electrodeposition and polishing are performed together, an insulating material, such as a polymeric or a ceramic material, is preferred. Although in this embodiment the asperities 120 have rectangular shapes, they may be shaped in various geometrical forms such as oval, square, circular or others. The shape and the volumetric space and the density of the asperities 120 define the uniformity of the deposited film. The inner side walls 150 of the asperities 120 do not need to be perpendicular to the upper and bottom surfaces 119 and 156, i.e., they can be slanted, curved or in other forms or shapes.

Figure 9C:
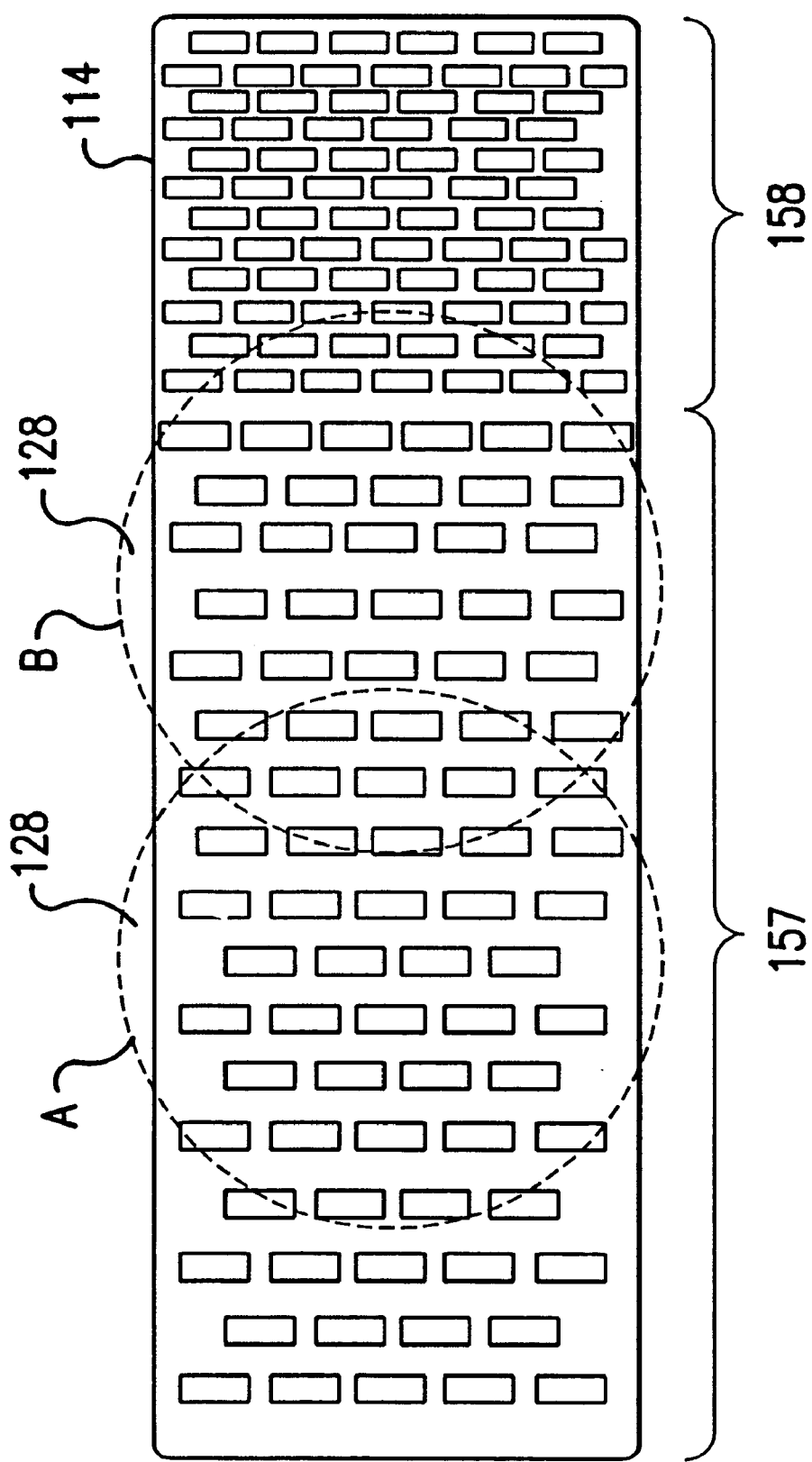
FIG. 9C is a schematic view of another embodiment of the shaping plate of the present invention wherein the shaping plate has two regions with differing opening densities.

FIG. 9C shows an alternative embodiment of the shaping plate 114. In this embodiment, the shaping plate 114 comprises first and second asperity regions 157 and 158 respectively. Due to its design, the second asperity region 158 has a higher degree of open area than the first asperity region 157, which results in higher copper deposition on the wafer. When the wafer is plated by oscillating it around position A in the first region 157, a certain deposition layer thickness profile can be obtained and the thickness of the deposited layer may be slightly thinner along the contact regions 128. In order to bring up the thickness along the contact regions 128, the wafer can be moved to position B, and partially over the second region 158, so as to expose contact regions 128 to higher copper deposition rate. This step may be carried out during a part of the electrodeposition process so that a uniform deposition profile of the depositing copper layer is achieved. It is also within the scope of the present invention that such high density areas can be formed at one or more locations on the shaping plate 114 and the thickness profile of the depositing layer can be changed or controlled at will. That is, the thickness profile across a front surface of a wafer can be made concave, convex, or entirely flat. With this embodiment, the edge exclusion can be made zero, i.e., the entire wafer front surface can be uniformly plated all the way to its edge.

Figure 10A:
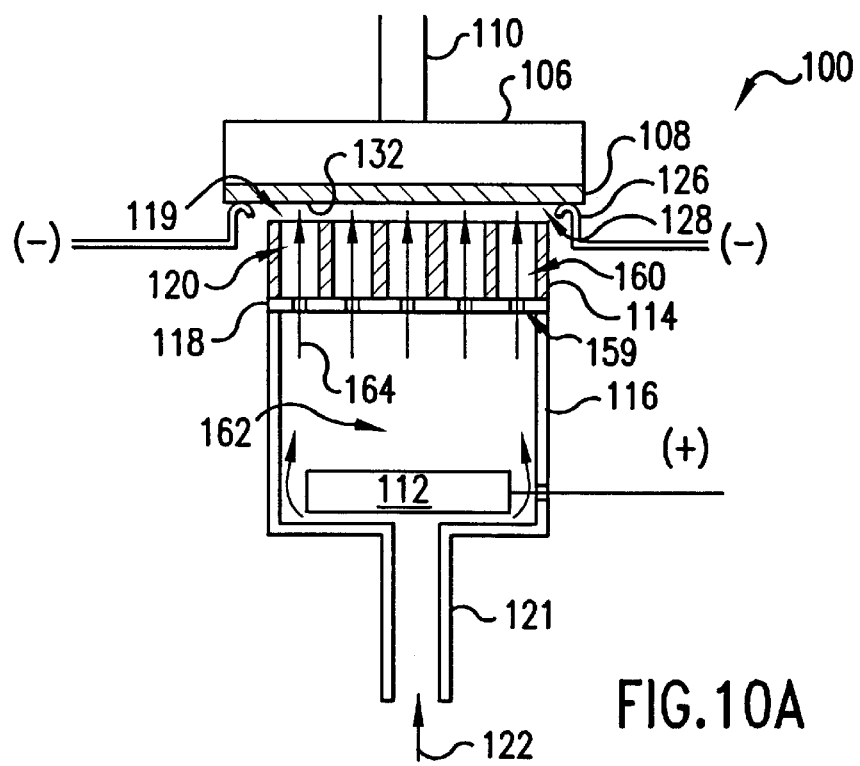
FIG. 10A is a schematic side view of the electrodeposition system of the present invention showing the position of the wafer electrical contacts on the contact regions relative to the width of the shaping plate of the present invention.
Figure 10B:
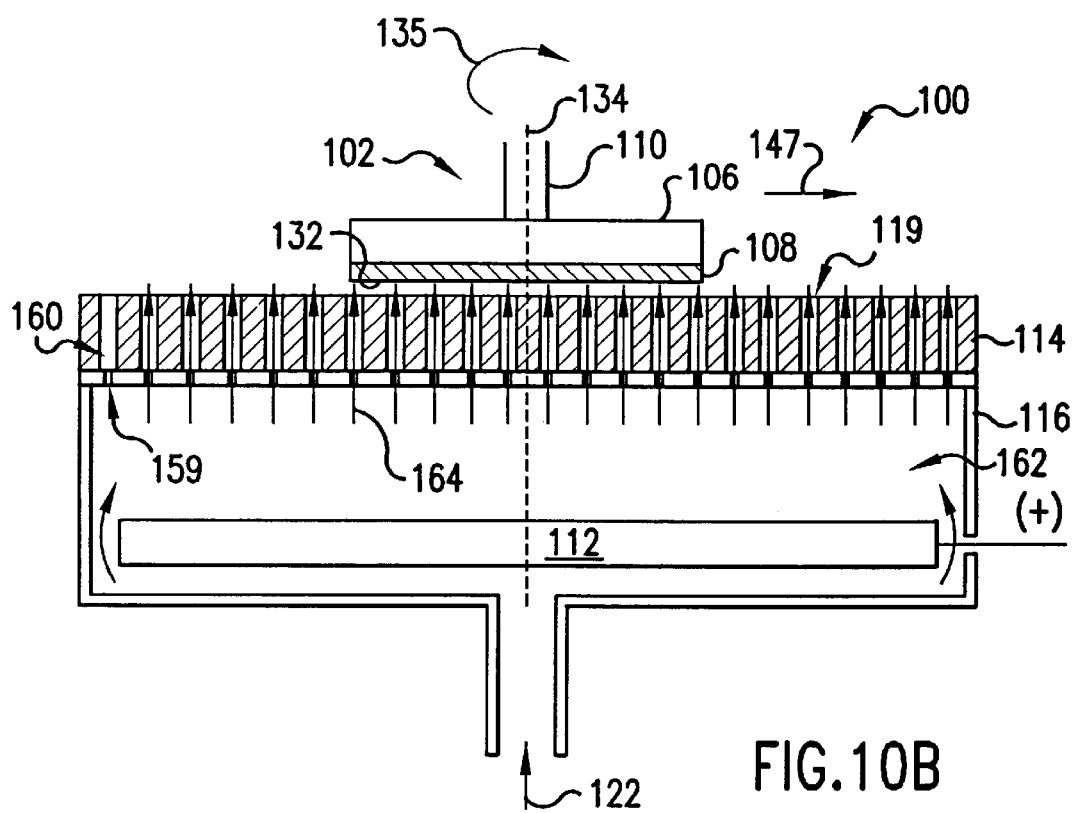
FIG. 10B is another schematic side view of the electrodeposition system of the present invention showing the position of the wafer along the length of the shaping plate of the present invention.

As shown in FIGS. 10A and 10B, the shaping plate 114 is placed on the anode plate 118 having a plurality of holes 159. The holes 159 in the anode plate 118 and the asperities 120 in the shaping plate 114 form continuous electrolyte channels 160 connecting an inner cavity 162 of the anode cup 116, which is filled with electrolyte during the process, to the upper surface 119 of the shaping plate 114. Electrolyte enters the anode cup in the direction of arrow 122 and flows through the channels 160 in the direction of arrows 164. There may be filters (not shown) placed in the inner cavity 162 to catch the particles generated by the dissolution of the anode 112 during electroplating. The anode plate 118 may be made of an insulating material or a conductive material. For the systems not using a consumable anode, the anode plate 118 may be used as anode or another inert cathode can be put in place of the anode 112. In such systems, the anode plates can be made of a metal such as titanium and can preferably be coated with an inert metal such as platinum. Accordingly, the positive voltage is connected to the anode plate rather than to the consumable anode, such as a copper anode in the case of present invention.

FIG. 10A also shows the position of the contact members 126 contacting contact regions 128. The contact members may be manufactured in a variety of configurations such as brushes, pins, rollers, flat surfaces and the like. The contact members should be well isolated from the anode, and are preferably stationary with the contact regions sliding over them. The contact members may also move with the wafer. The contact members are preferably made of or coated with flexible and corrosion resistant conductive materials such as platinum, ruthenium, rhodium and nitrides of refractory materials and such. As previously mentioned and shown in FIG. 10A, since no conventional clamp is used to establish electrical contact with the front surface 132 of the wafer 108, edge exclusion during deposition is advantageously reduced down to zero. Possible scratching of the contact areas by contact members can be avoided or minimized by assuring that the force applied by the contact members against the contact regions is minimal.

Referring back to FIG. 10A, in the process of the preferred embodiment, the electrolyte is pumped into the inner cavity 162 of the anode cup 116 of the electrodeposition system 100 in the direction of the arrow 122. Once the electrolyte fills the inner cavity 162, the electrolyte reaches the front surface 132 of the wafer 108 in the direction of the arrow 164 by flowing through the holes 159 in the anode plate 118 and then the asperities 120 in the shaping plate 114. Referring now to FIGS. 10A–10B, the front surface 132 of the wafer 108 may be held at a first position along the axis 134, preferably at close proximity, for example 0.25–5 millimeters distance, to the shaping plate 114. The gap between the front surface 132 of the wafer 108 and the shaping plate 114 can be adjusted by vertically moving the carrier assembly 102 along the axis 134. Subsequent to the adjustment of the distance between the front surface 132 and the upper surface of the shaping plate 114, the electrodeposition process is initiated by applying a potential difference between the anode 112 and the contact members 126. Accordingly, at this stage, the potential difference is such selected that the contact members become more cathodic (−) than the anode. Further, since the contact members touch the front surface 132 of the wafer 108, the front surface 132 is also rendered cathodic.

Figure 11A:
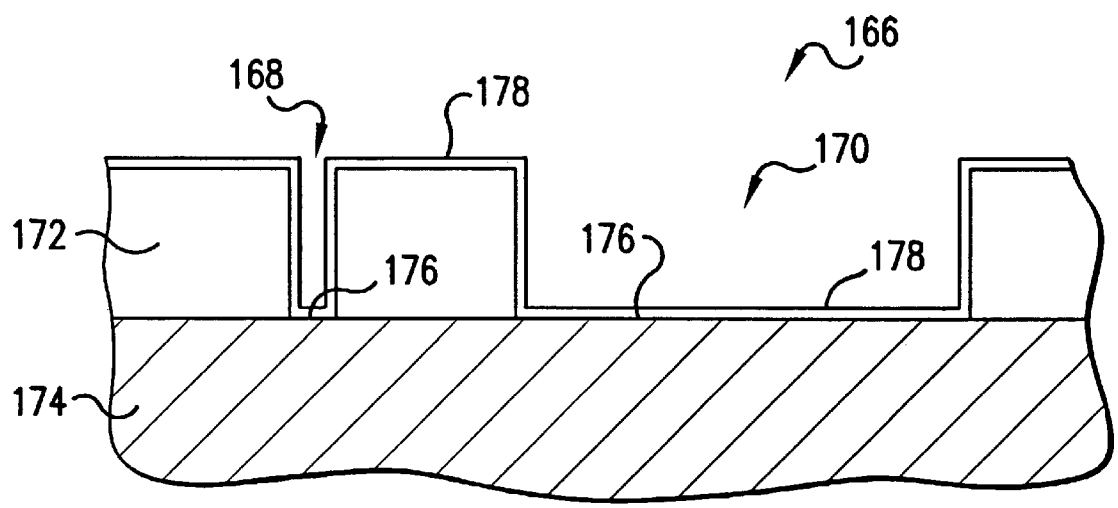
FIG. 11A is a highly magnified cross sectional view of a wafer having via and trench features covered with a seed layer prior to a deposition process of the present invention.
Figure 11B:
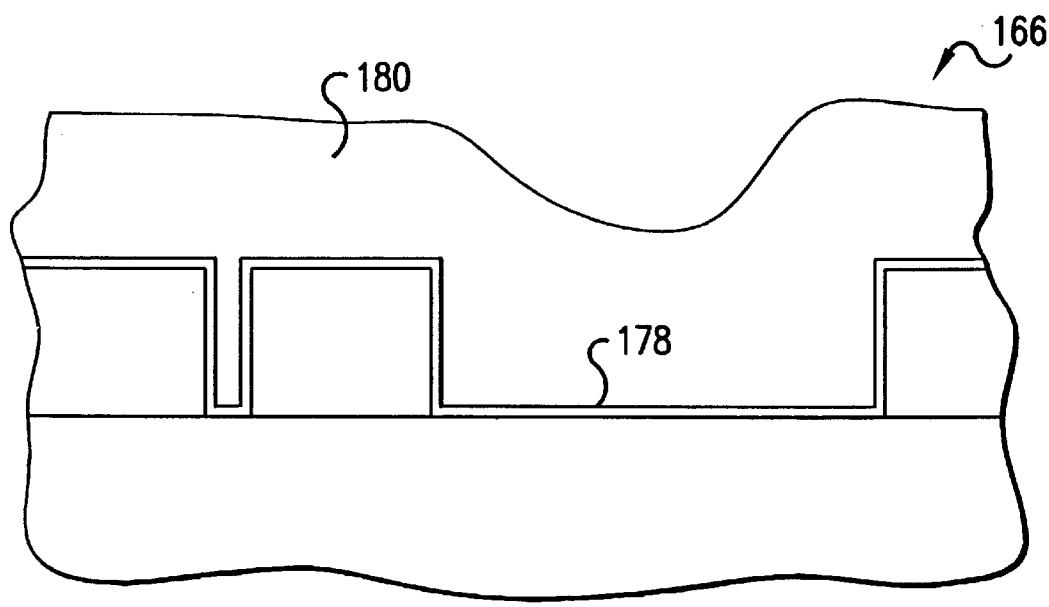
FIG. 11B is a schematic view of the structure shown in FIG. 11A, wherein the deposition layer has been electrodeposited using the present invention.

At this point, details of the electrodeposition process employing the system 100 of the present invention may be further described with help of FIGS. 11A and 11B. FIG. 11A exemplifies a surface portion 166 of the front surface 132 of the wafer 108 (see FIG. 8) prior to the electrodeposition process. The surface portion 166 may comprise a via feature 168 or a narrow hole and a trench 170 or a larger hole. The via feature 168 and the trench feature 170 may be formed in an insulator layer 172 that is formed on a substrate 174 which may be part of the wafer 108 or be formed on the wafer 108. The features 168 and 170 expose active device locations 176 on the substrate 174.

Referring to FIG. 10B, once the potential difference is applied, copper is plated onto the front surface 132 while the wafer 108 is rotated in the rotational direction 135 and moved linearly in the first direction 147 over the shaping plate 114 as in the manner shown in FIG. 10B. The first direction 147 is preferably parallel to the recessed edges 144 and perpendicular to the lateral edges 146. Although the linear motion in the first direction 147 may preferably be from about 5 millimeters to 100 millimeters depending upon the size of the wafer, longer linear motions are within the scope of this invention and can be utilized. In this respect, the rotation of the wafer 108 may be from approximately 1 rpm to 250 rpm. Although, it is preferable to move the wafer in lateral direction, it should be understood that the wafer may be rotated and the anode assembly may be moved laterally to obtain a similar motion between the wafer and the shaping plate. As shown in FIG. 11B, as the deposition process progresses, a deposition layer 180 is uniformly formed on the copper seed layer 178 and fills the via and trench features 168 and 170. As previously mentioned, the copper seed layer 178 may be formed on top of a barrier layer. As also previously mentioned, by rotating wafer 108, non-uniformity of the depositing layer will be minimized. The contact regions 128 on the wafer can only be plated with copper when the contact regions 128 are rotated over the asperities 120 of the shaping plate 114 and hence exposed to the electrolyte.

Figure 11C:
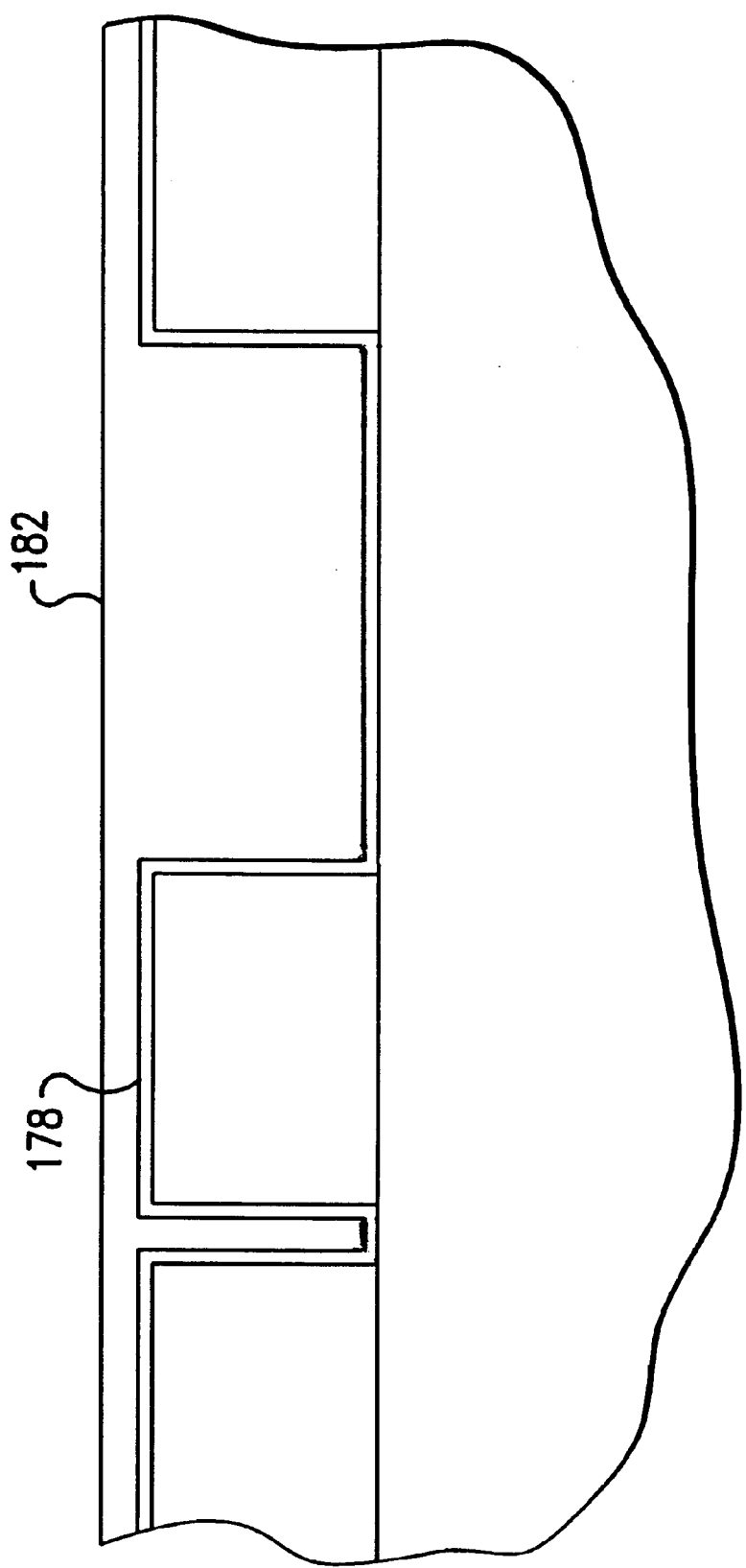
FIG. 11C is a schematic view of the structure shown in FIG. 11B wherein the deposition layer has been deposited in a planar manner.

Referring to FIG. 10B, to deposit planar films, the gap between the shaping plate 114 and the front surface of the wafer 108 may be reduced to zero and the front surface 132 is contacted with the upper surface 119 of the shaping plate 114 by moving the carrier assembly 102 and the wafer 108 vertically along the axis 134 into a second position. In this case the shaping plate may be made of a polishing pad. Alternatively, the anode assembly 104 may be vertically moved along the axis 134, if the assembly is equipped for such movement. In this second position, as the wafer 108 is rotated and moved along the first direction 147, the wafer 108 touches and rubs against the shaping plate 114 while the deposition process continues. As shown in FIG. 11C, this, in turn, forms a planarized layer 182 by minimizing the thickness of the deposition layer 180 on the tops of the insulating layer 172 whereas deposition of material in the features 168 and 170 is unimpeded.

If the polarity of the system is reversed, the system 100 may be used to remove material (electroetching) in a uniform manner from a wafer surface instead of depositing it in a uniform manner. In this case, the plating electrolyte may be replaced with a commonly known electroetching or electropolishing solution. The Cu anode may be replaced with an inert electrode made of inert material such as Pt, Ti or Pt coated Ti materials.

It should be understood, of course, that the foregoing relates to preferred embodiments of the invention and that modifications may be made without departing from the spirit and scope of the invention as set forth in the following claims.

We claim:

1. A system for depositing materials on a surface of a wafer having a lateral dimension, comprising:
   a cavity defined by a peripheral wall terminating at a peripheral edge and having at least one lateral dimension smaller than the wafer lateral dimension and at least one dimension larger than the wafer lateral dimension and configured to hold an electrolyte proximate to the peripheral edge such that the electrolyte will always contact a first wafer surface region;
   a head configured to hold the wafer above the cavity peripheral edge so that the surface of the wafer faces the cavity;
   an anode disposed in the cavity; and
   an electrical contact member positioned outside the cavity peripheral wall and configured to contact a second wafer surface region where the lateral dimension of the cavity is smaller than the wafer lateral dimension and to maintain electrical contact with the wafer when the wafer is moved relative to the contact member.

2. The system of claim 1, wherein the second wafer surface region is a contact region extending along the circumference of the wafer, and wherein the contact region surrounds the first region.

3. The system of claim 2, wherein the contact member is a conductive wire brush contacting the contact region.

4. The system of claim 1, wherein the electrolyte contacts the wafer when the electrolyte is flowed against the surface of the wafer.

5. The system of claim 1, wherein the head includes a vacuum suction device configured to retain the wafer.

6. The system of claim 5, wherein the head comprises a retaining ring to support the wafer along the circumference of the wafer.

7. The system of claim 1, wherein an area defined by the peripheral edge of the peripheral wall is larger than the area of the surface of the wafer.

8. A system for depositing materials on a surface of a wafer having a lateral dimension, comprising:
   an anode;
   a shaping plate defining an edge and being supported between the anode and the wafer surface such that an upper surface of the shaping plate faces the wafer surface, the shaping plate including a plurality of openings, wherein the upper surface of the shaping plate has a lateral dimension that is greater than the wafer lateral dimension and a lateral dimension that is less than the wafer lateral dimension;
   a liquid electrolyte adapted to flow through the openings of the shaping plate and against the wafer surface such that the electrolyte always contacts a first wafer surface region; and
   an electrical contact member adapted to establish electrical contact with a second wafer surface region adjacent the edge of the shaping plate, wherein the second wafer surface region intermittently contacts the electrolyte when the wafer is rotated over the shaping plate.

9. The system of claim 8, wherein the shaping plate has a first portion and a second portion.

10. The system of claim 9, wherein the second portion has a higher number of openings than the first portion.

11. The system of claim 9 wherein the second portion has openings with a larger total area than the first portion.

12. The system of claim 8, wherein the second region is a contact region extending along the circumference of the wafer and wherein the contact region surrounds the first region.

13. The system of claim 8, wherein the contact member is a conductive wire brush contacting the second region.

14. The system of claim 8, wherein the electrolyte contacts the surface of the wafer when the electrolyte flows against the surface of the wafer.

15. The system of claim 8, wherein the wafer is supported by a wafer carrier assembly from a back surface of the wafer.

16. The system of claim 14, wherein the wafer carrier includes a vacuum suction device configured to retain the wafer on the wafer carrier.

17. The system of claim 16, wherein the wafer carrier comprises a retaining ring to hold the wafer along the circumference of the wafer.

18. A process for depositing materials on a surface of a wafer without excluding any region for electrical contacts on the surface, wherein the wafer has a lateral dimension, the process comprising the steps of:

providing an anode;

supporting a shaping plate between the anode and the surface of the wafer such that an upper surface of the shaping plate faces the wafer surface, the shaping plate comprising a plurality of openings such that each opening puts the wafer surface in fluid communication with the anode, wherein the upper surface of the shaping plate has a lateral dimension that is greater than the wafer lateral dimension and a lateral dimension that is less than the wafer lateral dimension;

flowing an electrolyte through the openings of the shaping plate and between the anode and the wafer surface;

contacting a contact region of the wafer surface with a contact member at a location adjacent to an edge of the shaping plate to make electrical contact to the wafer surface;

applying a potential difference between the anode and the contact member to deposit material on a deposition region of the wafer surface through the shaping plate when the wafer is in a first position; and moving the wafer into a second position while contacting the contact region with the contact member thereby depositing material on both the contact region and the deposition region.

19. The process of claim 18, further comprising contacting the surface of the wafer with the shaping plate.

20. The process of claim 19, further comprising moving the wafer in a first direction with respect to the shaping plate while contacting the surface of the wafer with the shaping plate.

21. The process of claim 20, wherein the first direction is parallel to the edge of the shaping plate.

22. The process of claim 21, wherein moving the wafer in the first direction comprises moving the wafer from a first portion of the shaping plate to a second portion of the shaping plate.

23. The process of claim 22, wherein the number of openings in the first portion is less than the number of openings in the second portion so that the second portion provides a higher deposition rate.

24. A process for electroetching a conductive material from a surface of a wafer without excluding any region for electrical contacts on the surface, wherein the wafer has a lateral dimension, the process comprising the steps of:

providing an electrode, the electrode being placed into a cavity that is defined by a peripheral wall terminating at a peripheral edge, wherein a lateral dimension of the peripheral edge is greater than the wafer lateral dimension and a lateral dimension of the peripheral edge is less than the wafer lateral dimension;

supporting the wafer above the peripheral edge so that the surface of the wafer faces the cavity;

filling the cavity with an electrolyte such that the electrolyte contacts a first region of the surface of the wafer;

contacting a contact region of the surface of the wafer with a contact member positioned outside the cavity peripheral wall and configured to make electrical contact to the surface of the wafer;

applying a potential difference between the electrode and the contact member to continuously deposit material on the first region of the surface of the wafer through a shaping plate when the wafer is in a first position; and rotating the wafer into a second position while contacting the contact region with the contact member, thereby depositing material on both the first region and the contact region.

25. A process for electrodepositing a conductive material from a surface of a wafer without excluding any region for electrical contacts on the surface, wherein the wafer has a lateral dimension, the process comprising the steps of:

providing an electrode, the electrode being placed into a cavity defined by a peripheral wall terminating at a peripheral edge and having at least one lateral dimension smaller than the wafer lateral dimension and at least one dimension larger than the wafer lateral dimension;

supporting the wafer above the peripheral edge so that the surface of the wafer faces the cavity;

filling the cavity with an electrolyte such that the electrolyte contacts a first region of the surface of the wafer;

contacting a contact region of the surface of the wafer with a contact member positioned outside the cavity peripheral wall and configured to make electrical contact to the surface of the wafer;

applying a potential difference between the electrode and the contact member to continuously deposit material onto the first region of the surface of the wafer through a shaping plate when the wafer is in a first position; and rotating the wafer into a second position while contacting the contact region with the contact member, thereby depositing material onto both the first region and the contact region.

26. A system by which conductive material can be deposited out of an electrolyte onto a surface of a semiconductor substrate comprising:

an assembly by which the electrolyte is supplied to the surface of the substrate during deposition of the material;

an anode which is contacted by the electrolyte during said deposition; and at least one contact which is electrically interconnected with the surface at a selected area of the surface during said deposition;

wherein said deposition progresses discontinuously on said selected area and continuously on the rest of the surface as at least one of the contact and the surface moves with respect to the other during application of a potential difference between the anode and the contact.

27. The system of claim 26, and further comprising a device by which non-uniformity between deposition of said material on said selected area and on the rest of the surface is alleviated.

28. The system of claim 27, wherein the device includes a shield disposed between the anode and the surface to alter an electric field distribution.

29. The system of claim 28, wherein the shield includes openings defined therein.

30. The system of claim 27, wherein the device includes a perforated element provided between the anode and the surface with asperity regions having different degrees of open area.

31. The system of claim 30, wherein said element is a plate.

32. The system of claim 26, wherein said assembly comprises a cup defining a cavity through which the electrolyte flows during said deposition.

33. The system of claim 32, wherein said anode is received in said cavity.

34. The system of claim 32, wherein said contact is disposed outside of said cavity.

35. The system of claim 32, wherein said assembly further comprises an inlet for supplying the electrolyte to said cavity.

36. The system of claim 26, and further comprising a carrier which holds said substrate during said deposition.

37. The system of claim 36, wherein said carrier is rotatable so as to move the surface with respect to the contact.

38. The system of claim 26, and further comprising a shaping element disposed between said anode and said surface and at close proximity to said surface during said deposition.

39. The system of claim 38, wherein said shaping element is porous and permits through flow of said electrolyte.

40. The system of claim 38, wherein said element is a shaping plate.

41. A process by which conductive material can be deposited out of an electrolyte onto a surface of a semiconductor substrate comprising:

supplying the electrolyte to the surface of the substrate and contacting an anode with the electrolyte;

electrically interconnecting at least one contact with the surface at a selected area of the surface; and applying a potential difference between the anode and the contact while moving at least one of the contact and the surface with respect to the other so as to deposit said material discontinuously on said selected area and continuously on the rest of the surface.

42. The process of claim 41, and further comprising alleviating non-uniformity between deposition of said material on said selected area and on the rest of the surface.

* * * * *